United States Patent
Butler et al.

(10) Patent No.: US 6,333,939 B1
(45) Date of Patent: Dec. 25, 2001

(54) SYNCHRONIZATION OF A LOW POWER OSCILLATOR WITH A REFERENCE OSCILLATOR IN A WIRELESS COMMUNICATION DEVICE UTILIZING SLOTTED PAGING

(75) Inventors: Brian K. Butler, La Jolla; Nicholas K. Yu; Kenneth D. Easton, both of San Diego, all of CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 09/134,808

(22) Filed: Aug. 14, 1998

(51) Int. Cl.[7] .................................................. H04J 3/06
(52) U.S. Cl. ........................................ 370/503; 370/350
(58) Field of Search .................................. 370/503, 480, 370/311, 335, 347, 344, 341, 350, 337, 330, 318, 319, 320, 321, 441; 340/825.44, 331.1; 455/574, 343, 38.3; 375/362, 354, 356, 357, 359

(56) References Cited

U.S. PATENT DOCUMENTS 5,708,971 * 1/1998 Dent ...................................... 455/38.3
5,940,771 * 8/1999 Gollniek et al. ...................... 370/311
6,088,602 * 7/2000 Banistez ................................ 370/311

FOREIGN PATENT DOCUMENTS 0678990  10/1995  (EP) ................................ H04J/3/06
0851593   7/1998  (EP) ................................ H04B/1/16
9858460  12/1998  (WO) ............................... H04B/7/00

* cited by examiner

Primary Examiner—Dang Ton
(74) Attorney, Agent, or Firm—Philip R. Wadsworth; Charles D. Brown; Howard H. Seo

(57) ABSTRACT

A method and circuit for controlling a mobile station operating in a slotted paging environment. The circuit comprises a low power clock for generating a low frequency clock signal; a clock signal generator for generating a high frequency clock signal; a synchronization logic circuit for synchronizing the low frequency clock signal to the high frequency clock signal; a frequency error estimator for measuring an estimated low frequency clock error; and a sleep controller for removing power from the clock signal generator for the corrected sleep duration value, thereby conserving power between assigned paging slots. During the awake time, the low frequency clock signal is resynchronized to the high frequency clock, thereby correcting for any frequency error in the less accurate low power clock during sleep mode.

9 Claims, 2 Drawing Sheets

SYNCHRONIZATION OF A LOW POWER OSCILLATOR WITH A REFERENCE OSCILLATOR IN A WIRELESS COMMUNICATION DEVICE UTILIZING SLOTTED PAGING

BACKGROUND OF THE INVENTION

I. Field of the Invention

The present invention relates to clock signal generation in a wireless communication device. More particularly, the present invention relates to a novel and improved method and circuit for synchronizing a low power oscillator with a reference oscillator in a wireless communication device utilizing slotted paging.

II. Description of the Related Art

In a typical wireless communication system, slotted paging is employed to increase the standby time, and therefore the battery life, of the mobile station. The mobile station may be, for example, a cellular or PCS telephone, or a wireless local loop (WLL) handset. For example, in the wireless telephony system disclosed in U.S. Pat. No. 5,392,287, entitled "APPARATUS AND METHOD FOR REDUCING POWER CONSUMPTION IN A MOBILE RECEIVER", issued Feb. 21, 1995, assigned to the assignee of the present invention and incorporated herein by reference, a slotted paging system is disclosed.

In the just-mentioned patent, a system is described for reducing receiver power consumption in a communication system having a transmitter and one or more receivers, in which periodic messages from the transmitter to the receiver are scheduled in "slots." Each receiver is assigned a slot during which it monitors the transmissions. The transmitter transmits messages to the receiver only during the assigned slots. The receiver is in an "active state" during its assigned slot. It may remain in the active state after its assigned slot if the message requires the receiver to perform additional actions. This active state is often referred to as the "awake" state.

During the "inactive state," which is the time period between successive occurrences of its assigned slot, the receiver may perform any action not requiring coordination with the transmitter. It may conserve power during this time by removing power from one or more components such as those used for monitoring the transmissions. This inactive state is often referred to as a "sleep" state. At a time during the inactive state shortly before the assigned slot, the receiver applies power to these components and performs initializations. These initializations may include reacquiring a pilot channel signal to which the receiver may synchronize itself if its timing signals have drifted out of synchronization with those of the transmitter during the preceding inactive state.

When the mobile station is in a standby mode, i.e. it is not actively engaged in a call, the standby time, and thus the battery life, is dominated by how much current is consumed while the mobile station is in the sleep mode. In the typical mobile station, about half of the average current consumption during standby mode is consumed while the mobile station is in the sleep mode.

While the mobile station is in the sleep mode, it must at least maintain a counter to meter the sleep time, so that it will "wake up" on time for its next assigned slot. In most mobile stations, a very accurate time reference, such as a Temperature-Compensated Crystal Oscillator (TCXO), is used to meter the sleep time. Additionally, other clock signal generation circuitry such as clock buffers, clock dividers, and other related clock generation elements are typically required to generate a usable and reliable clock signal from the TCXO reference. Although this results in a highly accurate clocking scheme, all of these components consume a significant amount of current; on the order of 3 mA.

In order to decrease the current consumption during sleep, and thereby increase standby time, it has been proposed that the TCXO and related clock signal generation circuitry be turned off during sleep mode, and a low power, less accurate crystal oscillator be used in its place. Because the accuracy permitted and the high frequencies generated by the TCXO matters mostly when the mobile station is awake, it has been proposed that the low power oscillator be used to meter the sleep periods, where accuracy is less critical, and high clock frequency resolution is not as important.

Additionally, low power, low frequency crystal oscillators are relatively cheap to make, and are immensely popular in such applications as wristwatches. They are, therefore, in ready supply. They also consume very little current compared to the more accurate crystal oscillators; on the order of 0.015 mA. All of these advantages of current savings and cost make them attractive for use in metering the sleep period in a mobile station.

However, these low power, low frequency crystal oscillators are also notoriously susceptible to temperature variations, varying on the order of 60 PPM over the expected operational temperature range. They are uncorrectable and uncompensated. Additionally, they are coarse in time resolution. All of these errors detract from their ability to properly monitor the sleep period in a mobile station.

One way to compensate for the errors inherent in these low power crystal oscillators is suggested by U.S. Pat. No. 5,428,820, entitled "ADAPTIVE RADIO RECEIVER CONTROLLER METHOD AND APPARATUS", issued Jun, 27, 1995, and assigned to Motorola. In this patent, the mobile station utilizes a low cost, low power, low frequency oscillator to meter the sleep period. The error inherent in the low power oscillator is accounted for by adapting the length of the current sleep period depending on the timing accuracy of the previous sleep period. In other words, if the previous sleep period was too long due to errors in the low power oscillator, the mobile station wakes up earlier in the current sleep period. In order to determine whether the sleep period was too long or short, the mobile station looks for a unique word, such as a message preamble from the transmitter, which signifies the beginning of its assigned slot. If a unique word is not received, the mobile station woke up too late, and therefore the sleep duration is decreased. If a valid unique word is received, the mobile station woke up on time or too early, and therefore the sleep duration is increased slightly.

A significant drawback of the 5,428,820 patent is that it relies on the occasional incorrect reception of the unique word to find the correct sleep period. Also if the unique word is not correctly received and demodulated, the sleep duration is changed based on the expectation that the sleep period was the wrong length. There may be several other reasons besides the duration of the sleep period that the unique word was not correctly received and demodulated, including communication channel quality conditions.

What is needed is a method and circuit for accounting for errors in the low power oscillator that avoids the limitations of the prior art, while reliably metering the sleep period in a mobile station.

SUMMARY OF THE INVENTION

The present invention is a novel and improved method and circuit for controlling a mobile station operating in a slotted paging environment. The invention takes advantage of the fact that the mobile station is receiving a stable time reference from the transmitter for the entire time that it is awake and monitoring its assigned paging slot. During this awake time, the low frequency clock signal is resynchronized to the high frequency clock, thereby avoiding the prior art limitation of having to receive and demodulate a unique word in order to determine the proper sleep period.

The circuit comprises a low power clock for generating a low frequency clock signal; a clock signal generator for generating a high frequency clock signal; a synchronization logic circuit for synchronizing the low frequency clock signal to the high frequency clock signal; a frequency error estimator for measuring an estimated low frequency clock error; and a sleep controller for removing power from the clock signal generator for the corrected sleep duration value. In the preferred embodiment, the circuit further comprises a programmable counter for metering the corrected sleep duration value, and the sleep controller programs the programmable counter with the corrected sleep duration value.

In one embodiment, the synchronization logic circuit comprises at least one digital latch for aligning a rising edge of the low frequency clock signal to a rising edge of the high frequency clock signal. The frequency error estimator may also comprise a counter for counting a number of high frequency clock signal periods per low frequency clock signal period; and an accumulator for accumulating a difference between an expected number of high frequency clock signal periods per low frequency clock signal period and an actual number of high frequency clock signal periods per low frequency clock signal period.

BRIEF DESCRIPTION OF THE DRAWINGS

The features, objects, and advantages of the present invention will become more apparent from the detailed description set forth below when taken in conjunction with the drawings in which like reference characters identify correspondingly throughout and wherein.

DETAILED DESCRIPTION OF THE PREFERRED EMBODIMENTS

The present invention is particularly useful in a wireless communication device or mobile station such as a portable radiotelephone, which operates in a slotted paging environment. In slotted paging operation, the mobile station remains asleep during its non-assigned paging slots, and awakens promptly before its assigned paging slot as described above with reference to the incorporated U.S. Pat. No. 5,392,287.

Figure 1:
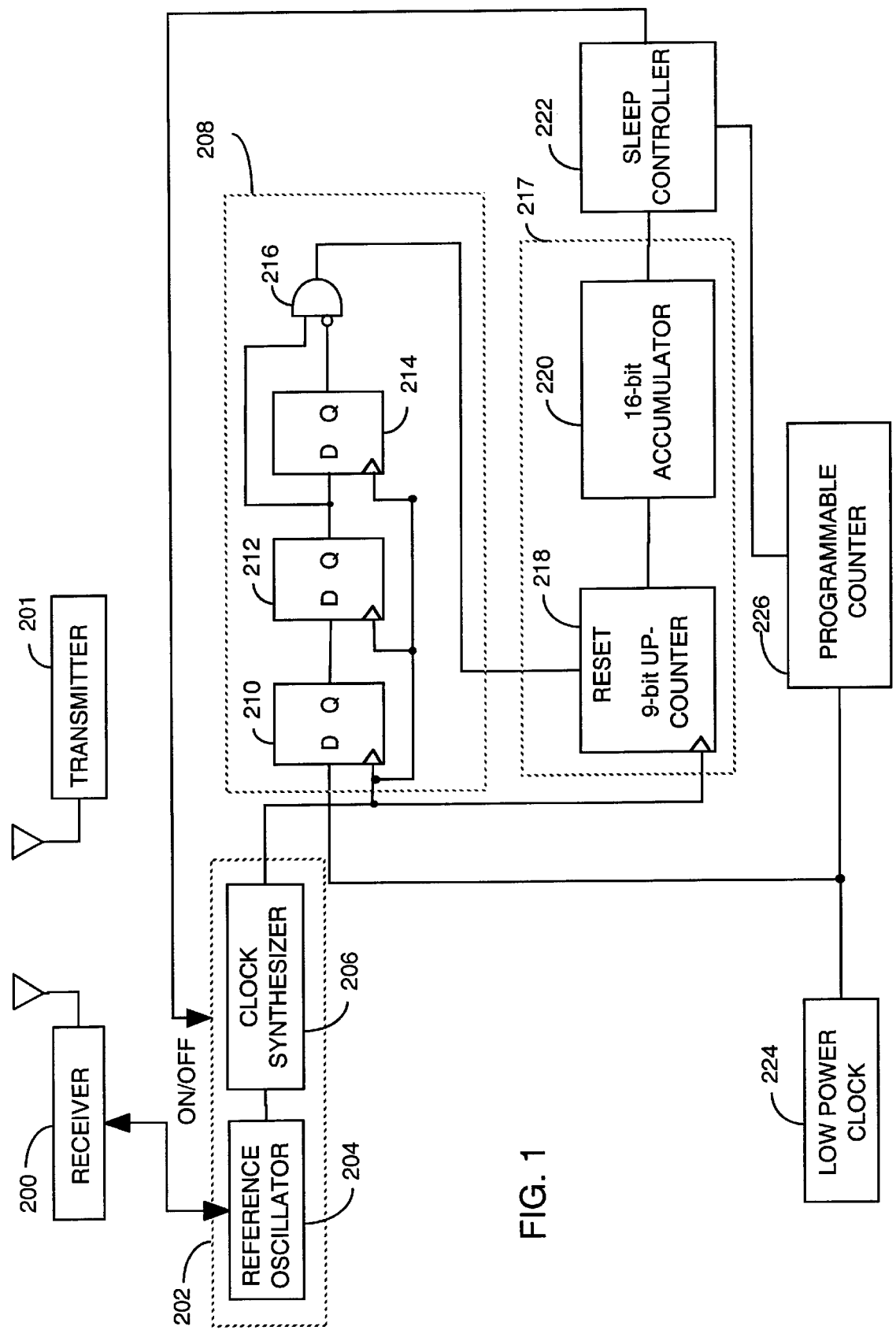
FIG. 1 is a functional block diagram of the circuit of the present invention.

FIG. 1 shows a functional block diagram of the circuit of the present invention. Clock signal generator 202 generates a high frequency, high accuracy clock signal. Preferably, clock signal generator 202 includes a reference oscillator 204 and a clock synthesizer 206 as shown. However, clock signal generator 202 may be any clock signal generation circuit as is known in the art. The present invention is not limited by the actual construction of the clock signal generator 202.

In the preferred embodiment, reference oscillator 204 may be a compensated and correctable crystal oscillator such as a TCXO or Voltage Controlled TCXO (VCTCXO) as are known in the art. Reference oscillator 204 preferably generates a high frequency signal for use by receiver 200 in acquiring and demodulating RF signals. As such, reference oscillator 204 is optimized for accurate high frequency signal generation. In the preferred embodiment, reference oscillator 204 generates a 19.68 MHz signal or other suitable RF reference frequency 19.2, 19.8 (MHz) et cetera. Clock synthesizer 206 preferably comprises digital clock generation logic, including frequency dividers, clock buffers, and other components as are conventional in the art for clock generation. In the preferred embodiment, the dock signal generated by clock synthesizer 206 has a frequency of 9.8304 MHz.

When the mobile station using the present invention is awake, it monitors its assigned paging channel. From this assigned paging channel, the mobile station acquires an accurate timing reference. Receiver 200 receives and demodulates the paging channel transmitted by transmitter 201 as is known in the art using the reference frequency provided by reference oscillator 204. The construction of one embodiment of receiver 200 is further described in U.S. patent application Ser. No. 08/779,601, entitled "DUAL-MODE DIGITAL FM COMMUNICATION SYSTEM", filed Jan. 7, 1997, assigned to the assignee of the present invention and incorporated herein by reference.

The receiver 200, as described in the just-mentioned patent, includes a frequency tracking loop, commonly called "AFC" (Automatic Frequency Control), (not shown) which generates a frequency error signal for use by the reference oscillator in response to the phase of the received RF signals from the transmitter 201. Since the phase of RF signals transmitted by transmitter 201 is synchronized to a stable system time, receiver 200 may derive a stable time reference from the phase of the received RF signals. The frequency error signal applied to reference oscillator 204 facilitates closed-loop tracking of the received RF carrier frequency, resulting in a very robust, stable, and highly accurate high frequency reference signal output from reference oscillator 204 to clock synthesizer 206. Phase and frequency tracking loops are well known in the art, and many different loops may be used as desired to correct the frequency of reference oscillator 204.

Furthermore, it should be noted that the present invention is not applicable solely to applications in which there is an external time reference available. In other words, clock signal generator 202 may be a stand-alone reference, located either within or outside of the mobile station. In the case of a stand-alone reference, it would be assumed that the clock signal generator 202 is sufficiently accurate without any external correction.

Clock signal generator 202 also includes an enable input, labeled as "ON/OFF" in FIG. 1, where an enable signal may be applied to either turn on or turn off clock signal generator 202. When clock signal generator 202 is on, it generates the clock signal as described above. However, when a disable signal is applied to the enable input of clock signal generator 202, it ceases to generate the clock signal as described above. The voltage regulator may also be disabled. Furthermore, when clock signal generator 202 is disabled, substantially all of the components that comprise clock signal generator 202 are powered down. Thus, when the disable signal is applied to the enable input of clock signal generator 202, it consumes substantially zero current.

Low power clock 224, on the other hand, is preferably a 32.768 kHz crystal oscillator and associated circuitry as commonly available and described above. However, it should be noted that in other embodiments, other oscillator designs may be used without changing the nature of the present invention. In the preferred embodiment, low power clock 224 remains powered on continuously while the mobile station is powered on. This is in contrast to the clock signal generator 202, which is powered off when the mobile station is in sleep mode. Low power clock 224 remains powered on, generating a low frequency clock signal when the mobile station is in sleep mode.

Sleep controller 222 programs a sleep duration value into programmable counter 226. The duration of the sleep interval depends on the length of time between successive assigned slots, as well as an estimate of the frequency error of the low power clock 224 as will be described below. Sleep controller 222 may be a conventional microprocessor as is known in the art, programmed with software instructions, which control the entry and exit from sleep mode, along with associated circuitry and memory. It should be noted that although sleep controller is illustrated as a single functional block, it may be physically implemented as several components and associated software. Programmable counter 226 may be any suitable counter or timer as is known in the art.

The low frequency clock signal generated by low power clock 224 is received as one input to programmable counter 226. Clocked by the low frequency clock signal, programmable counter 226 counts down to expiration according to the sleep duration value previously programmed by sleep controller 222. Upon expiration of programmable counter 226, an enable signal is output from sleep controller 222 to the enable input of clock signal generator 202. In this manner, the clock signal generator 202 turned on when the mobile station exits sleep mode and prepares to monitor its assigned paging channel slot.

Conversely, after monitoring its assigned paging channel slot, if there are no more messages for the mobile station, sleep controller 222 sends a disable signal to the enable input of clock signal generator 202, thereby powering down substantially all of the clock signal generation components that comprise clock signal generator 202, including the reference oscillator 204 and the clock synthesizer 206, leaving only low power clock 224 energized to clock the next sleep duration value loaded by sleep controller 222 into programmable counter 226.

As described so far, it is clear that the present invention saves current during sleep mode by powering off clock signal generator 202 during sleep mode, while leaving low power clock 224 energized to time the sleep duration. However, as noted above, the low power clock 224 has some expected frequency error due to the nature of its construction, as well as temperature and manufacturing quality. The present invention accounts for the error in the low power clock 224 by resynchronizing the low-frequency clock 224 with the more accurate and stable clock signal generator 202.

The low frequency clock signal generated by low power clock 224 is received as a first input to synchronization logic 208. The high frequency clock signal generated by clock signal generator 202 is received as a second input to synchronization logic 208.

The preferred embodiment of synchronization logic 208 is illustrated in FIG. 1 as three serially connected inverting latches, followed by an AND gate having one inverted input. However, it should be noted that other digital logic may be used to accomplish the same function without departing from the present invention.

In the preferred embodiment, the high frequency clock signal generated by clock signal generator 202 is received as the clock input to a first latch 210. The low frequency clock signal generated by low power clock 224 is received as the data input to the first latch 210. As is known in the art, a typical digital latch has a setup and hold time and produces the same logical value (or the inverse thereof) at the output as is present at the input when the latch is clocked. Thus, the output of the first latch 210 will be a waveform that is has a very similar shape and period as the low frequency clock signal generated by low power clock 224, although it may be inverted if first latch 210 is an inverting latch. The significant difference will be that the rising or falling edges of the output from first latch 210 will be synchronized to those of the high frequency clock signal which is clocking the first latch 210.

The output of the first latch 210 is received as the data input to a second latch 212. Likewise, the output of the second latch 212 is received as the data input to a third latch 214. All of the latches 210–214 are clocked by the high frequency clock signal generated by clock signal generator 202. Second latch 212 and the third latch 214 perform the same synchronizing function as described above with reference to the first latch 210.

Finally, the output of the third latch 214 is received as an inverted input to AND gate 216, with the output of the second latch 212 being applied as the noninverting input of AND gate 216. As will be apparent to one of ordinary skill in the art, the latches 210–214 and the AND gate 216 serve to synchronize the low frequency clock signal generated by low power clock 224 to the high frequency clock signal generated by clock signal generator 202, and to do edge detection.

It should be noted that more or fewer latches, and other digital logic may be employed in place of those illustrated in FIG. 1. Other implementations for synchronization logic 208 will be obvious to those of ordinary skill in the art. However, in the preferred embodiment, to avoid any meta-stability problems associated with latches, and known in the art, more than one latch is used to reduce the statistical likelihood of meta-stability of the latch, and resultant loss of the low frequency clock signal waveform integrity.

Synchronization logic 208 outputs a synchronized low frequency clock signal to frequency error estimator 217. In the preferred embodiment, frequency estimator 217 comprises a 9-bit up-counter 218, and a 16-bit accumulator 220. The synchronized low frequency clock signal is applied to the reset input of 9-bit up-counter 218. The high frequency clock signal generated by clock signal generator 202 is applied to the clock input of 9-bit up-counter 218. In the preferred embodiment, 9-bit up-counter 218 is reset to −300 (−160 hexidecimal) by the synchronized low frequency clock signal. Thus, for each period of the synchronized low frequency clock signal, the 9-bit up-counter is reset and restarted to count up from −300. Since the frequency of the high frequency clock signal generated by clock signal generator 202 is 9.8304 MHz, and the frequency of the synchronized low frequency clock signal produced by synchronization logic 208 is 32.768 kHz in the preferred embodiment, then there are nominally exactly 300 periods of the high frequency clock signal for every one period of the synchronized low frequency clock signal. As such, for each time the 9-bit up-counter 218 is reset to −300 by the synchronized low frequency clock signal, it should nominally have counted all the way back up to zero by the clocking of the high frequency clock signal.

Because the 9-bit up-counter 218 should have nominally counted back to zero before being reset, any count that is still left, or any extra counts beyond zero, represents the estimated frequency error for the low power clock 224 for that one low frequency clock signal period. Each of these individual error counts are applied to the input of a 16-bit accumulator 220 where they are accumulated over 256 periods of the synchronized low frequency clock signal. 16-bit accumulator 220 then provides the estimated frequency error to sleep controller 222.

It should be noted that the exact bit size and construction of 9-bit up-counter 218 and 16-bit accumulator 220 are not critical to the present invention. Other counters of greater or lesser size, such as 8-bit counters or 10-bit counters may be used without departing from the present invention. Also, it would be obvious to one of ordinary skill in the art to replace the 9-bit up-counter 218 with a similarly sized down-counter, which was reset to +300. Furthermore, Likewise, the reset value of −300 used by 9-bit up-counter 218 is merely the frequency of the high frequency clock signal divided by the frequency of the synchronized low frequency clock signal, and any other reset value could be used depending of the actual frequencies involved. Also, in another embodiment, the counter 218 itself is not reset, but a constant may be subtracted from its output in order to normalize the error.

Additionally, it will be obvious to one of ordinary skill in the art that 16-bit accumulator 220 may be replaced by a device of different size or construction such as an integrate-and-dump element. Accumulating the estimated frequency error over 256 cycles was chosen as a statistically significant and convenient number for averaging. Thus, the present invention is not limited to the number of cycles over which the estimated frequency error is averaged. Lastly, it should be noted that the frequency error estimator 217 may easily be designed to use other digital logic circuits that perform the same function of generating an estimated frequency error of the synchronized low frequency clock signal, without departing from the present invention.

As previously stated, the estimated frequency error of the synchronized low frequency signal is provided by 16-bit accumulator 220 to sleep controller 222. Multiple Accumulator outputs may be averaged or filtered together in the microprocessor software to generate accurate frequency error for sleep. Also, as previously stated, sleep controller 222 generates a sleep duration value in response to the period between successive assigned paging slots. Sleep controller 222 arithmetically adds this estimated frequency error to the sleep duration value, to generated a corrected sleep duration value. The corrected sleep duration value is then used to program programmable counter 226, thereby accounting for frequency errors in the low power clock 224.

In other words, if the low power clock 224 is losing time as compared to the more accurate clock signal generator 202, then the estimated frequency error produced by 16-bit accumulator 220 will be negative. As a result, sleep controller 222 will subtract off the estimated frequency error from the sleep duration value. The resultant corrected sleep duration value used to program programmable counter 226 will therefore be less than the nominal duration that would otherwise be required based solely on the inter-slot sleep period. This will cause the programmable counter 226 to expire earlier, thus waking up the mobile station "on time" for its next assigned slot. The converse operation is true if the low power clock 224 is gaining time as compared to the dock signal generator 202.

Figure 2:
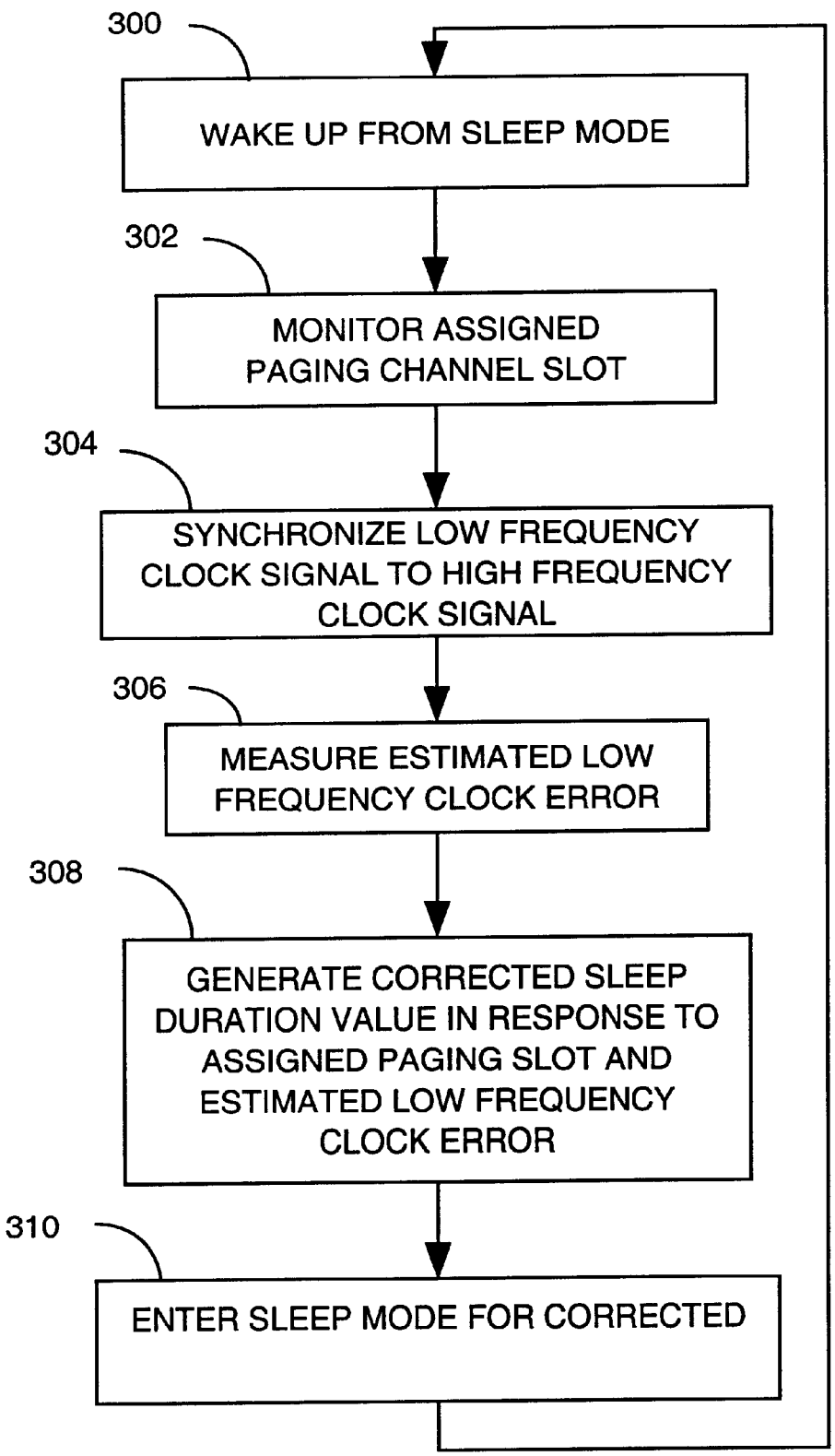
FIG. 2 is a flow diagram of the method of the present invention.

Turning now to FIG. 2, a flow diagram of the method of the present invention, as implemented by the circuit of FIG. 1, is shown. It should be understood that some of the steps may be performed in parallel. The process begins at block 300 where the mobile station in which the present invention resides is "awake," meaning that it has applied power to all components necessary to receive and demodulate signals from the transmitter 201. This includes powering on clock signal generator 202 so that it generates the high frequency clock signal for use by the receiver 200, and the synchronization logic 208.

At block 302 the mobile station reacquires the paging channel as is known in the art, and begins to monitor its assigned paging channel slot. While the mobile station is awake and monitoring its assigned slot, the process moves to block 304 where the low frequency clock signal is synchronized to the high frequency clock signal by synchronization logic 208 as described above. Since the mobile station may be awake for 20 or 40 ms while monitoring its assigned slot, the synchronization logic 208 will have enough time to perform the resynchronization while the mobile station is awake.

At block 306, the estimated low frequency clock error is measured. In the preferred embodiment of FIG. 1, this step is performed as described with respect to 9-bit up-counter 218 and 16-bit accumulator 220. At block 308, the sleep controller 222 generates a corrected sleep duration value in response to the assigned paging slot (i.e. the time interval between successive assigned paging slots), and the estimated frequency error of the low frequency clock. After this step is performed, the low power clock 224 frequency error is corrected for, and the mobile station reenters the sleep mode for the corrected sleep duration value which was loaded into programmable counter 226 as described above with reference to FIG. 1.

The previous description of the preferred embodiments is provided to enable any person skilled in the art to make or use the present invention. The various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

We claim:

1. A circuit for controlling a mobile station operating in a slotted paging environment, the circuit comprising:

a low power clock for generating a low frequency clock signal;

a clock signal generator for generating a high frequency clock signal;

a synchronization logic circuit for synchronizing said low frequency clock signal to said high frequency clock signal;

a frequency error estimator for measuring an estimated low frequency clock error;

a sleep duration value generator for generating a corrected sleep duration value in response to said estimated low frequency clock error; and a sleep controller for removing power from said clock signal generator for said corrected sleep duration value; and a programmable counter for metering said corrected sleep duration value, and wherein said sleep controller programs said programmable counter with said corrected sleep duration value.

2. A circuit for controlling a mobile station operating in a slotted paging environment, the circuit comprising:
- a low power clock for generating a low frequency clock signal;
- a clock signal generator for generating a high frequency clock signal;
- a synchronization logic circuit for synchronizing said low frequency clock signal to said high frequency clock signal, wherein said synchronization logic circuit comprises at least one digital latch for aligning a edge of said low frequency clock signal to a rising edge of said high frequency clock signal;
- a frequency error estimator for measuring an estimated low frequency clock error; a sleep duration value generator for generating a corrected sleep duration value in response to said estimated low frequency clock error; and
- a sleep controller for removing power from said clock signal generator for said corrected sleep duration value.

3. A circuit for controlling a mobile station operating in a slotted paging environment, the circuit comprising:
- a low power clock for generating a low frequency clock signal;
- a clock signal generator for generating a high frequency clock signal;
- a synchronization logic circuit for synchronizing said low frequency clock signal to said high frequency clock signal;
- a frequency error estimator for measuring an estimated low frequency clock error, wherein said frequency error estimator comprises:
  - a counter for counting a number of high frequency clock signal periods per low frequency clock signal period; and
  - an accumulator for accumulating a difference between an expected number of high frequency clock signal periods per low frequency clock signal period and an actual number of high frequency clock signal periods per low frequency clock signal period;
- a sleep duration value generator for generating a corrected sleep duration value in response to said estimated low frequency clock error; and
- a sleep controller for removing power from said clock signal generator for said corrected sleep duration value.

4. A method for controlling a mobile station operating in a slotted paging environment, comprising the steps of:
- generating a low frequency clock signal;
- generating a high frequency clock signal;
- synchronizing said low frequency clock signal to said high frequency clock signal;
- measuring an estimated low frequency clock error;
- generating a corrected sleep duration value in response to said estimated low frequency clock error;
- entering a sleep mode for said corrected sleep duration value;
- programming a programmable counter with said corrected sleep duration value; and
- metering said corrected sleep duration value.

5. A method for controlling a mobile station operating in a slotted paging environment, comprising the steps of:
- generating a low frequency clock signal;
- generating a high frequency clock signal;
- synchronizing said low frequency clock signal to said high frequency clock signal, wherein said step of synchronizing said low frequency clock signal to said high frequency clock signal comprises aligning an edge of said low frequency clock signal to a rising edge of said high frequency clock signal;
- measuring an estimated low frequency clock error;
- generating a corrected sleep duration value in response to said estimated low frequency clock error; and
- entering a sleep mode for said corrected sleep duration value.

6. A method for controlling a mobile station operating in a slotted paging environment, comprising the steps of:
- generating a low frequency clock signal;
- generating a high frequency clock signal;
- synchronizing said low frequency clock signal to said high frequency clock signal;
- measuring an estimated low frequency clock error, wherein said step of measuring an estimated low frequency clock error comprises the steps of:
  - counting a number of high frequency clock signal periods per low frequency clock signal period; and
  - accumulating a difference between an expected number of high frequency clock signal periods per low frequency clock signal period and an actual number of high frequency clock signal periods per low frequency clock signal period;
- generating a corrected sleep duration value in response to said estimated low frequency clock error; and
- entering a sleep mode for said corrected sleep duration value.

7. Apparatus for controlling a mobile station operating in a slotted paging environment, comprising:
- means for generating a low frequency clock signal;
- means for generating a high frequency clock signal;
- means for synchronizing said low frequency clock signal to said high frequency clock signal;
- means for measuring an estimated low frequency clock error;
- means for generating a corrected sleep duration value in response to said estimated low frequency clock error;
- means for entering a sleep mode for said corrected sleep duration value;
- means for programming a programmable counter with said corrected sleep duration value; and
- means for metering said corrected sleep duration value.

8. Apparatus for controlling a mobile station operating in a slotted paging environment, comprising:
- means for generating a low frequency clock signal;
- means for generating a high frequency clock signal;
- means for synchronizing said low frequency clock signal to said high frequency clock signal, wherein said means for synchronizing said low frequency clock signal to said high frequency clock signal comprises means for aligning an edge of said low frequency clock signal to a rising edge of said high frequency clock signal;
- means for measuring an estimated low frequency clock error;
- means for generating a corrected sleep duration value in response to said estimated low frequency clock error; and
- means for entering a sleep mode for said corrected sleep duration value.

9. Apparatus for controlling a mobile station operating in a slotted paging environment, comprising:

means for generating a low frequency clock signal;

means for generating a high frequency clock signal;

means for synchronizing said low frequency clock signal to said high frequency clock signal;

means for measuring an estimated low frequency clock error, wherein said means for measuring an estimated low frequency clock error comprises:

means for counting a number of high frequency clock signal periods per low frequency clock signal period; and means for accumulating a difference between an expected number of high frequency clock signal periods per low frequency clock signal period and an actual number of high frequency clock signal periods per low frequency clock signal period;

means for generating a corrected sleep duration value in response to said estimated low frequency clock error; and means for entering a sleep mode for said corrected sleep duration value.

* * * * *